(12) United States Patent
Sakai et al.

(10) Patent No.: US 9,104,112 B2
(45) Date of Patent: Aug. 11, 2015

(54) MASK BLANK, METHOD OF MANUFACTURING THE SAME, AND TRANSFER MASK

(75) Inventors: Kazuya Sakai, Shinjuku-ku (JP);
Masahiro Hashimoto, Shinjuku-ku (JP);
Takeyuki Yamada, Shinjuku-ku (JP)

(73) Assignee: HOYA CORPORATION, Tokyo (JP)

( * ) Notice: Subject to any disclaimer, the term of this patent is extended or adjusted under 35 U.S.C. 154(b) by 203 days.

(21) Appl. No.: 13/823,206

(22) PCT Filed: Sep. 29, 2011

(86) PCT No.: PCT/JP2011/072327
§ 371 (c)(1),
(2), (4) Date: Mar. 14, 2013

(87) PCT Pub. No.: WO2012/043695
PCT Pub. Date: Apr. 5, 2012

(65) Prior Publication Data
US 2013/0177841 A1    Jul. 11, 2013

(30) Foreign Application Priority Data
Sep. 30, 2010 (JP) ................................. 2010-220521

(51) Int. Cl.
*G03F 1/50* (2012.01)
*G03F 1/38* (2012.01)

(52) U.S. Cl.
CPC ... *G03F 1/50* (2013.01); *G03F 1/38* (2013.01)

(58) Field of Classification Search
CPC .... G03F 1/50; H01L 21/0274; H01L 21/3105

USPC ...................... 430/5, 311, 322, 323
See application file for complete search history.

(56) References Cited

U.S. PATENT DOCUMENTS

| 5,714,306 A * | 2/1998 | Komatsu et al. ............... 430/323 |
| 2006/0088774 A1 | 4/2006 | Yoshikawa et al. |
| 2010/0081066 A1 | 4/2010 | Nozawa |
| 2011/0223756 A1* | 9/2011 | Schaeffer et al. ............. 438/591 |

FOREIGN PATENT DOCUMENTS

| JP | 2005-010467 A | 1/2005 |
| JP | 2006-146152 A | 6/2006 |
| JP | 2006-259293 A | 9/2006 |
| JP | 2010-079110 A | 4/2010 |

OTHER PUBLICATIONS

International Search Repoort of PCT/JP2011/072327, dated Jan. 10, 2012.

* cited by examiner

*Primary Examiner* — Stephen Rosasco
(74) *Attorney, Agent, or Firm* — Sughrue Mion, PLLC

(57) ABSTRACT

Provided is a mask blank that is improved in adhesion of a thin film for forming a transfer pattern to a resist, thus capable of suppressing the occurrence of collapse, chipping, or the like of a formed resist pattern. The mask blank has, on a transparent substrate 1, a thin film 2 which is for forming a transfer pattern and is made of a material containing a metal. The thin film 2 has a surface modified layer in the form of an oxide film containing a hydrocarbon. The surface modified layer of the thin film 2 can be formed by, for example, causing a highly concentrated ozone gas and an unsaturated hydrocarbon gas to act on the thin film.

14 Claims, 3 Drawing Sheets

(a)

(b)

MASK BLANK, METHOD OF MANUFACTURING THE SAME, AND TRANSFER MASK

CROSS REFERENCE TO RELATED APPLICATIONS

This is a National Stage of International Application No. PCT/JP2011/072327 filed Sep. 29, 2011, claiming priority based on Japanese Patent Application No. 2010-220521 filed Sep. 30, 2010, the contents of all of which are incorporated herein by reference in their entirety.

TECHNICAL FIELD

This invention relates to a mask blank which is used for producing a photomask (transfer mask) for use in the manufacture of an electronic device such as a semiconductor device, to a method of manufacturing such a mask blank, and to such a transfer mask.

BACKGROUND ART

Generally, fine pattern formation is carried out by the photolithography in manufacturing processes of a semiconductor device. A number of substrates called photomasks (hereinafter referred to as transfer masks) are normally used for this fine pattern formation. The transfer mask comprises generally a transparent glass substrate having thereon a fine pattern made of a metal thin film or the like. The photolithography is used also in the manufacture of the transfer mask.

In the manufacture of a transfer mask by the photolithography, use is made of a mask blank having a thin film (e.g. a light-shielding film or the like) for forming a transfer pattern (mask pattern) on a transparent substrate such as a glass substrate. The manufacture of the transfer mask using the mask blank comprises an exposure process of applying required pattern writing to a resist film formed on the mask blank, a developing process of developing the resist film according to the required pattern writing to form a resist pattern, an etching process of etching the thin film according to the resist pattern, and a process of stripping and removing the remaining resist pattern. In the developing process, a developer is supplied after applying the required pattern writing to the resist film formed on the mask blank to dissolve a portion of the resist film soluble in the developer, thereby forming the resist pattern. In the etching process, using this resist pattern as a mask, an exposed portion of the thin film, where the resist pattern is not formed, is dissolved by dry etching or wet etching, thereby forming a required mask pattern on the transparent substrate. In this manner, the transfer mask is produced.

For miniaturization of a pattern of a semiconductor device, it is necessary to shorten the wavelength of an exposure light source for use in the photolithography in addition to the miniaturization of the mask pattern formed in the transfer mask. In recent years, the wavelength of an exposure light source in the manufacture of a semiconductor device has been shortened from KrF excimer laser (wavelength 248 nm) to ArF excimer laser (wavelength 193 nm) and further to EUV (wavelength 13.4 nm).

As a type of transfer mask, a halftone phase shift mask is known apart from a conventional binary mask having a light-shielding film pattern made of a chromium-based material or the like on a transparent substrate. This halftone phase shift mask is configured to have a phase shift film on a transparent substrate. This phase shift film is made of, for example, a material containing a molybdenum silicide compound or the like and is adapted to transmit light having an intensity that does not substantially contribute to exposure (e.g. 1% to 30% at an exposure wavelength) and to provide a predetermined phase difference. By means of light-semitransmissive portions formed by patterning the phase shift film and light-transmissive portions formed with no phase shift film and adapted to transmit light having an intensity that substantially contributes to exposure, the halftone phase shift mask provides a relationship in which the phase of the light transmitted through the light-semitransmissive portions is substantially inverted with respect to the phase of the light transmitted through the light-transmissive portions. As a consequence, the lights having passed near the boundaries between the light-semitransmissive portions and the light-transmissive portions and bent into the others' regions due to the diffraction phenomenon cancel each other out. This makes the light intensity at the boundaries approximately zero to thereby improve the contrast, i.e. the resolution, at the boundaries.

In recent years, there have also appeared a binary mask blank for ArF excimer laser using a material containing a molybdenum silicide compound as a light-shielding film, and so on.

The miniaturization of the mask pattern formed in the transfer mask requires a reduction in the thickness of the resist film in the mask blank and dry etching as a patterning technique in the manufacture of the transfer mask.

However, the reduction in the thickness of the resist film and the dry etching have the following technical problems.

One problem is that the processing time of, for example, the light-shielding film exists as one major restriction to the reduction in the thickness of the resist film of the mask blank. When chromium, for example, is used as a material of the light-shielding film, a mixed gas of chlorine gas and oxygen gas is used as an etching gas in dry etching of chromium. When patterning the light-shielding film by dry etching using the resist pattern as a mask, since the resist film is an organic film composed mainly of carbon, it is very weak against an oxygen plasma forming a dry etching environment. While patterning the light-shielding film by dry etching, the resist pattern formed on the light-shielding film should remain with a sufficient thickness. As one index, in order to make excellent the cross-sectional shape of the mask pattern, the resist film is required to have a thickness that still remains even when the etching time is about twice a just etching time (100% overetching). For example, since, in general, the etching selectivity of chromium as the material of the light-shielding film to the resist film is 1 or less, the thickness of the resist film is required to be twice or more that of the light-shielding film. Therefore, it is necessary to shorten the processing time of the light-shielding film for reducing the thickness of the resist film and, for that purpose, it is important to reduce the thickness of the light-shielding film. However, while reducing the thickness of the light-shielding film, the light-shielding film is required to have a predetermined optical density (normally 3.0 or more at a wavelength of exposure light for use with a mask) for ensuring its light-shielding performance and therefore the reduction in the thickness of the light-shielding film has its own limitation.

In view of this, as a method of reducing the thickness of the resist film, there has conventionally been proposed a method of forming, on a light-shielding film, an etching mask film made of a material having an etching selectivity to the light-shielding film, then etching the etching mask film using a resist pattern as a mask to form an etching mask film pattern, and then etching the light-shielding film using the etching mask film pattern as a mask to form a light-shielding film pattern (e.g. Patent Document 1 etc.).

PRIOR ART DOCUMENT

Patent Document

Patent Document 1: JP-A-2006-146152

SUMMARY OF THE INVENTION

Problem to be Solved by the Invention

Meanwhile, when forming a resist pattern in a resist film, if the line width of the resist pattern becomes smaller than 1/3 of the thickness of the resist film, collapse, chipping, or the like of the resist pattern occurs, and therefore the thickness of the resist film should be set to three times or less than the line width of the resist pattern. Taking this into account, the thickness of the resist film should be set to 180 nm or less in the DRAM half-pitch 32 nm generation and further to 100 nm or less in the DRAM half-pitch 22 nm generation. However, as described above, even if the above-mentioned etching mask film is provided, the processing time of, for example, the light-shielding film (or the etching mask film) exists as one major restriction to the reduction in the thickness of the resist film of the mask blank. Therefore, it is difficult to simply achieve only the reduction in the thickness of the resist film.

Further, if the adhesion of the pattern-forming thin film (e.g. the light-shielding film) of the mask blank to the resist is poor, the above-mentioned problem of collapse, chipping, or the like of the resist pattern becomes more significant. For example, in the case of an oxynitride of silicon or a material containing an oxynitride of silicon and a transition metal, the adhesion to the resist is lower than that of a chromium-based material so that even if the resist film thickness is less than 1/3 of the line width of a formed resist pattern, collapse or chipping of the resist pattern tends to occur. In recent years, a chemically amplified resist with high resolution has often been used as a resist. In the case of this chemically amplified resist, the adhesion to the resist is insufficient even with the chromium-based material.

While the demand for miniaturization of a mask pattern formed in a transfer mask has been increasing more and more, it has been an important subject to improve the adhesion to a resist in a mask blank in terms of achieving further miniaturization of the mask pattern.

Therefore, this invention has been made in order to solve the conventional problems and has an object to provide a mask blank that is improved in adhesion to a resist by carrying out surface modification of a thin film for use in forming a transfer pattern, thus capable of suppressing the occurrence of collapse, chipping, or the like of a formed resist pattern, a method of manufacturing such a mask blank, and a transfer mask.

Means for Solving the Problem

As a result of intensive studies for solving the above-mentioned problems, the present inventors have found that, in a mask blank having a thin film which is for forming a transfer pattern and is made of a material containing a metal, if a surface modified layer in the form of an oxide film containing a hydrocarbon is formed at a surface of the thin film, the adhesion to a resist can be improved without degrading the optical properties, the surface roughness, or the like of the thin film. Further, the present inventors have also found that, in order to form the oxide film containing the hydrocarbon at the surface of the thin film without degrading the optical properties, the surface roughness, or the like of the thin film, a treatment of causing a mixed gas of highly concentrated ozone gas and unsaturated hydrocarbon gas to act on the surface of the thin film is optimal.

The present inventors have completed this invention as a result of further continuing intensive studies based on the elucidated fact described above.

Specifically, in order to solve the above-mentioned problems, this invention has the following structures.

(Structure 1)
A mask blank comprising, on a substrate, a thin film which is for forming a transfer pattern and made of a material containing a metal, wherein the thin film has a surface modified layer comprising an oxide film containing a hydrocarbon.

(Structure 2)
The mask blank according to Structure 1, wherein the thin film is a laminated film and an uppermost layer of the laminated film is made of a material containing, as the metal, a transition metal.

(Structure 3)
The mask blank according to Structure 2, wherein the transition metal is chromium, and wherein the surface modified layer is such that when an O (oxygen) 1s spectrum measured by X-ray photoelectron spectroscopy (XPS) is separated into a first peak at a binding energy of about 532 eV and a second peak at a binding energy of about 530 eV, a ratio of a first peak area to a second peak area is 2.0 or more.

(Structure 4)
The mask blank according to Structure 2, wherein the transition metal is tantalum.

(Structure 5)
The mask blank according to any one of Structures 1 to 4, wherein the surface modified layer has a surface roughness (Ra) of 0.70 nm or less.

(Structure 6)
The mask blank according to any one of Structures 1 to 5, wherein the surface modified layer has a thickness in a range of 3 nm or less.

(Structure 7)
The mask blank according to Structure 1, wherein the thin film is a laminated film and an uppermost layer of the laminated film is made of a material containing a transition metal and silicon.

(Structure 8)
The mask blank according to any one of Structures 1 to 7, comprising a chemically amplified resist film formed on the thin film.

(Structure 9)
The mask blank according to Structure 8, wherein the chemically amplified resist film is of a negative type (Structure 10)
A transfer mask obtained by patterning the thin film in the mask blank according to any one of Structures 1 to 9 to form a transfer pattern.

(Structure 11)
A mask blank manufacturing method comprising the steps of: forming, on a substrate, a thin film which is for forming a transfer pattern and is made of a material containing a metal; and applying, to the thin film, a treatment of forming a surface modified layer comprising an oxide film containing a hydrocarbon at a surface of the thin film.

(Structure 12)
The mask blank manufacturing method according to Structure 11, wherein the treatment causes an ozone gas and an unsaturated hydrocarbon gas to act on the thin film.

(Structure 13)

The mask blank manufacturing method according to Structure 12, wherein the ozone gas has a concentration of 50 to 100 vol %.

(Structure 14)

The mask blank manufacturing method according to Structure 12 or 13, wherein the unsaturated hydrocarbon is a low-grade unsaturated hydrocarbon having a carbon number of 1 to 4.

Effect of the Invention

According to a mask blank of this invention, since a thin film, which is for forming a transfer pattern and is made of a material containing a metal, on a transparent substrate has at its surface a surface modified layer comprising an oxide film containing a hydrocarbon, the adhesion to a resist can be improved without degrading the optical properties, the surface roughness, or the like of the thin film. As a result, it is possible to suppress the occurrence of collapse, chipping, or the like of a formed resist pattern.

According to a mask blank manufacturing method of this invention, without degrading the optical properties, the surface roughness, or the like of such a thin film for forming the transfer pattern, the surface modified layer comprising the oxide film containing the hydrocarbon can be formed at the surface of the thin film to thereby improve the adhesion to the resist.

According to a transfer mask of this invention, since its transfer pattern is formed using the mask blank of this invention, there is obtained the transfer mask in which a 32 nm half-pitch fine pattern, for example, is formed with high pattern accuracy.

MODE FOR CARRYING OUT THE INVENTION

Hereinbelow, an embodiment of this invention will be described in detail.

As the above-mentioned invention of Structure 1, this invention is a mask blank comprising, on a transparent substrate, a thin film which is for forming a transfer pattern and is made of a material containing a metal, wherein the thin film has a surface modified layer comprising an oxide film containing a hydrocarbon.

Figures 1, 2:
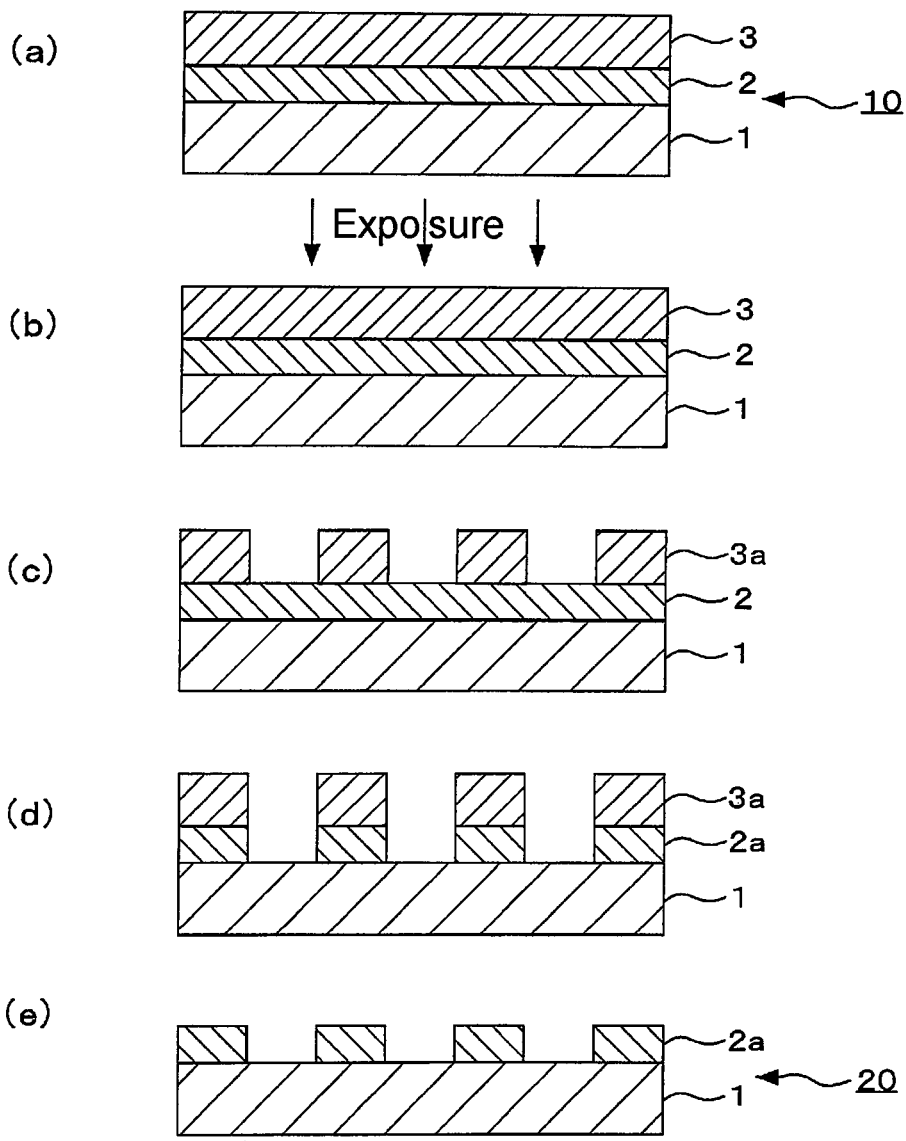
FIG. 1 is a cross-sectional view of a mask blank.
FIG. 2 is cross-sectional views showing processes of manufacturing a transfer mask using the mask blank.

FIG. 1 is a cross-sectional view showing an embodiment of a mask blank of this invention. According to this, a mask blank 10 of this embodiment has, on a transparent substrate 1, a thin film 2 which is for forming a transfer pattern and is made of a material containing a metal.

The transparent substrate 1 is not particularly limited as long as it has transparency at an exposure wavelength to be used. In this invention, a quartz substrate and various other glass substrates (e.g. soda-lime glass, aluminosilicate glass, etc.) can be used. Among them, the quartz substrate is particularly suitable for this invention because it has high transparency in the range of ArF excimer laser to shorter wavelengths.

The thin film 2 for forming the transfer pattern is a thin film made of a material containing a metal such as a transition metal and may be a single layer or a laminated layer. In the case of the laminated layer, at least an uppermost layer (outermost surface layer) is a layer made of a material containing the above-mentioned metal. While details will be described later, there can be cited, for example, a light-shielding film made of a material containing a transition metal alone, such as chromium, tantalum, or tungsten or containing its compound, an etching mask film provided on a light-shielding film or the like, or the like. There can also be cited a light-semitransmissive film, a light-shielding film, or the like made of a material containing a compound of transition metal silicide (particularly, molybdenum silicide).

A sputtering film forming method, for example, is preferably cited as a method of forming the thin film 2 on the transparent substrate 1, but this invention is not necessarily limited to the sputtering film forming method.

The mask blank 10 of this invention has a surface modified layer in the form of an oxide film containing a hydrocarbon at a surface (or a surface layer portion) of the thin film 2. This surface modified layer is the oxide film containing the hydrocarbon and, since particularly an oxide containing the hydrocarbon (hereinafter referred to as an organic-based oxide) is contained much in the oxide film, the affinity for a resist comprising an organic component is high so that the adhesion to the resist can be significantly improved.

As a method of forming the surface modified layer containing the organic-based oxide at the surface (surface layer portion) of the thin film 2, there can be cited, for example, a treatment of causing a highly concentrated ozone gas and an unsaturated hydrocarbon gas to act on the surface of the thin film. Incidentally, there is conventionally known a method of heating a mask blank in the atmosphere or in an atmosphere with an oxygen content higher than that of the atmosphere to form an oxide film at a surface of a thin film, thereby improving chemical resistance and so on. In this case, the possibility is considered that an oxide containing an organic contaminant or the like in the atmosphere may be formed. According to a study by the present inventors, even if an organic component due to the organic contaminant in the atmosphere is contained in the oxide film, the content thereof is so low that the adhesion to a resist cannot possibly be improved. Further, if the heat treatment is carried out at a high temperature for a long time for improving chemical resistance and so on, the occurrence of degradation of the thin film, degradation of the surface roughness of the thin film, change in the optical properties of the thin film, or change in the flatness of the mask blank cannot be avoided, leading to a possibility that the performance of the mask blank is degraded. On the other hand, according to the above-mentioned treatment of causing the highly concentrated ozone gas and the unsaturated hydrocarbon gas to act on the surface of the thin film, the surface modified layer can be formed at a low temperature in a short time and thus the surface roughness, the optical properties, or the like of the thin film is not degraded at all. Accordingly, the surface modified layer in the form of the oxide film containing much organic-based oxide can be formed at the surface of the thin film while the properties of the mask blank are maintained. This is suitable for this invention.

According to a study by the present inventors, it is considered that, by carrying out the treatment of causing the highly concentrated ozone gas and the unsaturated hydrocarbon gas to act on (supplying them to) the surface of the thin film as described above, an unstable intermediate such as ozonide is formed and that, in the course of decomposition of this unstable intermediate, the surface of the thin film is modified so that the oxide film containing the organic-based oxide is formed.

As a method of causing the highly concentrated ozone gas and the unsaturated hydrocarbon gas to act on the surface of the thin film, there can be cited, for example, a method in which the mask blank is placed in a proper chamber and then the highly concentrated ozone gas and the unsaturated hydrocarbon gas are introduced into the chamber and mixed together near the surface of the thin film of the mask blank. Alternatively, it may be a method that supplies the highly concentrated ozone gas and the unsaturated hydrocarbon gas by, for example, spraying the gases directly on the surface of the thin film. In order to satisfactorily obtain the effect of this invention, the highly concentrated ozone gas and the unsaturated hydrocarbon gas are preferably mixed together near the surface of the thin film to act on the surface of the thin film.

As the above-mentioned unsaturated hydrocarbon, there can be cited, for example, a hydrocarbon (alkene) having a double bond of carbon, such as ethylene or butylene, a hydrocarbon (alkyne) having a triple bond of carbon, such as acetylene, or the like. Particularly, such a low-grade unsaturated hydrocarbon having a carbon number of about 1 to 4 is preferable.

The concentration of the ozone gas is preferably in a range of 50 to 100 vol %. If the concentration of the ozone gas is less than 50 vol %, there is a possibility that the treatment time is required to be very long or that even if the treatment time is prolonged, the thickness required for improving the adhesion to the resist cannot be ensured. The concentration of the ozone gas is preferably 100 vol % because the surface modified layer can be formed in a short treatment time at a low substrate heating temperature.

The supply ratio (flow rate ratio) of the ozone gas to the unsaturated hydrocarbon gas is preferably 1:1 to 4:1. If it is in this range, a reaction between the ozone gas and the unsaturated hydrocarbon gas is satisfactorily carried out.

The treatment time (time for causing the highly concentrated ozone gas and the unsaturated hydrocarbon gas to act) may be properly determined taking into account the ozone gas concentration, the substrate heating temperature, the thickness of the surface modified layer, the coverage, and so on.

Such a surface modification treatment of causing the highly concentrated ozone gas and the unsaturated hydrocarbon gas to act can be carried out at room temperature. On the other hand, in order to further promote the reaction in which the oxide film containing the organic-based oxide is formed on the surface of the thin film, the substrate may be heated to about 50° C. to 80° C., for example. In this case, if the heating temperature is too high, although depending on the material of the thin film, in the case of, for example, a film of a chromium-based material, there is a possibility that the film is degraded if the heating temperature exceeds 100° C.

Meanwhile, a mask blank before resist coating is sometimes placed in a receiving case or the like and stored for a certain period of time and, depending on storage conditions, a chemical contaminant such as a basic substance or an organic substance may adhere to the mask blank. Such a chemical contaminant causes functional degradation (degradation of a pattern shape due to sensitivity change, reduction in resolution, or the like) of particularly a chemically amplified resist. Therefore, the mask blank should be cleaned before resist coating to remove such a chemical contaminant. By causing the highly concentrated ozone gas and the unsaturated hydrocarbon gas to act, not only the surface modification but also the removal of the chemical contaminant can be simultaneously carried out and thus the cleaning treatment before resist coating can be eliminated. That is, the surface modification treatment can also serve as the cleaning treatment.

In the mask blank 10 of this invention, the surface roughness (Ra) of the surface modified layer of the thin film is 0.70 nm or less. In this invention, since it is possible to prevent degradation of the surface roughness due to the formation of the surface modified layer at the surface of the thin film, the surface roughness of the surface of the thin film, i.e. the surface roughness of the surface of the surface modified layer, can be suppressed to Ra=0.70 nm or less and further to Ra=0.50 nm or less.

By suppressing the surface roughness to Ra=0.70 nm or less and further to Ra=0.50 nm or less, LER (Line Edge Roughness) of a thin film pattern can be made small and further the cross-sectional shape of the thin film pattern can also be made excellent, which is thus preferable. In the case where the surface modified layer of the thin film is formed by the highly concentrated ozone gas treatment of this invention, the surface roughness does not change or hardly changes before and after the formation of the surface modified layer.

In this invention, the unit Ra representing the surface roughness can be measured by an atomic force microscope (AFM). While specific measurement is carried out in a region of, for example, 1 μm square, it is preferable to have a uniform surface roughness in an effective area of a mask. Herein, in the case of a 6-inch substrate, a region of, for example, about 142 mm square may be considered as an effective area of a mask.

Further, in the case where the surface modified layer of the thin film is formed by the highly concentrated ozone gas treatment of this invention, the optical density (OD) and the surface reflectance at a wavelength of exposure light or inspection light hardly change (degrade) before and after the formation of the surface modified layer. Further, the amount of change in flatness (absolute value) can be 30 nm or less and further 10 nm or less before and after the formation of the surface modified layer.

The flatness described in this invention is a value representing a warp (deformation amount) of a surface given by TIR (Total Indicated Reading). In this invention, the flatness is given by a measurement value in a 142×142 mm area. For example, it is a measurement value in a 142×142 mm area at the center of a 6-inch substrate.

As described above, since the optical density, the surface reflectance, and the flatness change amount are not degraded, no influence is exerted on the performance of a mask blank or a transfer mask. Further, when manufacturing a transfer mask by patterning a thin film formed with a surface modified layer, since the etching characteristics of the thin film are not degraded, the processing accuracy of the transfer mask is also not reduced.

Further, it is also suitable for transfer masks which use the double patterning/double exposure techniques. Since these exposure techniques use a set of two transfer masks, the requirement for the accuracy of the two transfer masks is strict. This invention can satisfy such a requirement. When a surface modified layer is formed in an etching mask film of a mask blank particularly of the type in which the etching mask film is stripped in the form of a transfer mask, an underlying film can be etched well using an etching mask film pattern as a mask and further an inspection such as a defect inspection of the mask blank can be carried out well.

Figure 3:
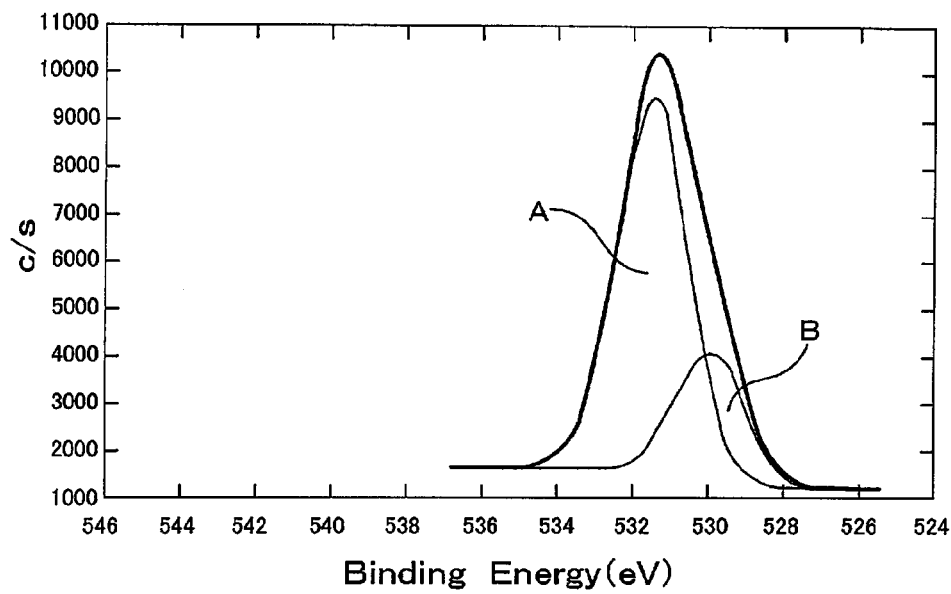
FIG. 3 shows the results of analysis by X-ray photoelectron spectroscopy of a surface modified layer in Example 1, wherein (a) is O1s spectra of the surface modified layer and (b) is O1s spectra of a surface layer portion of a light-shielding film before applying a surface modification treatment.
Figure 3:
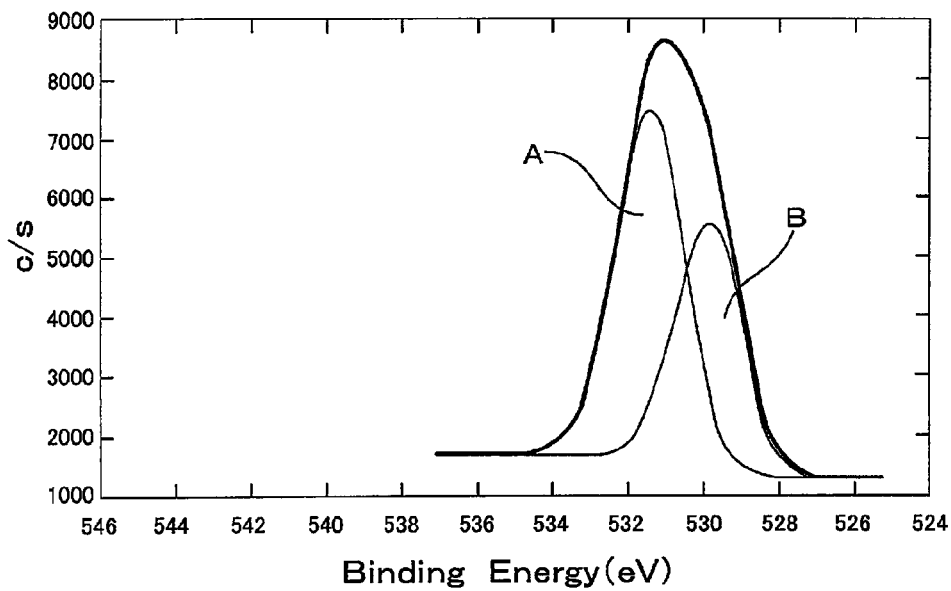
Figure 4:
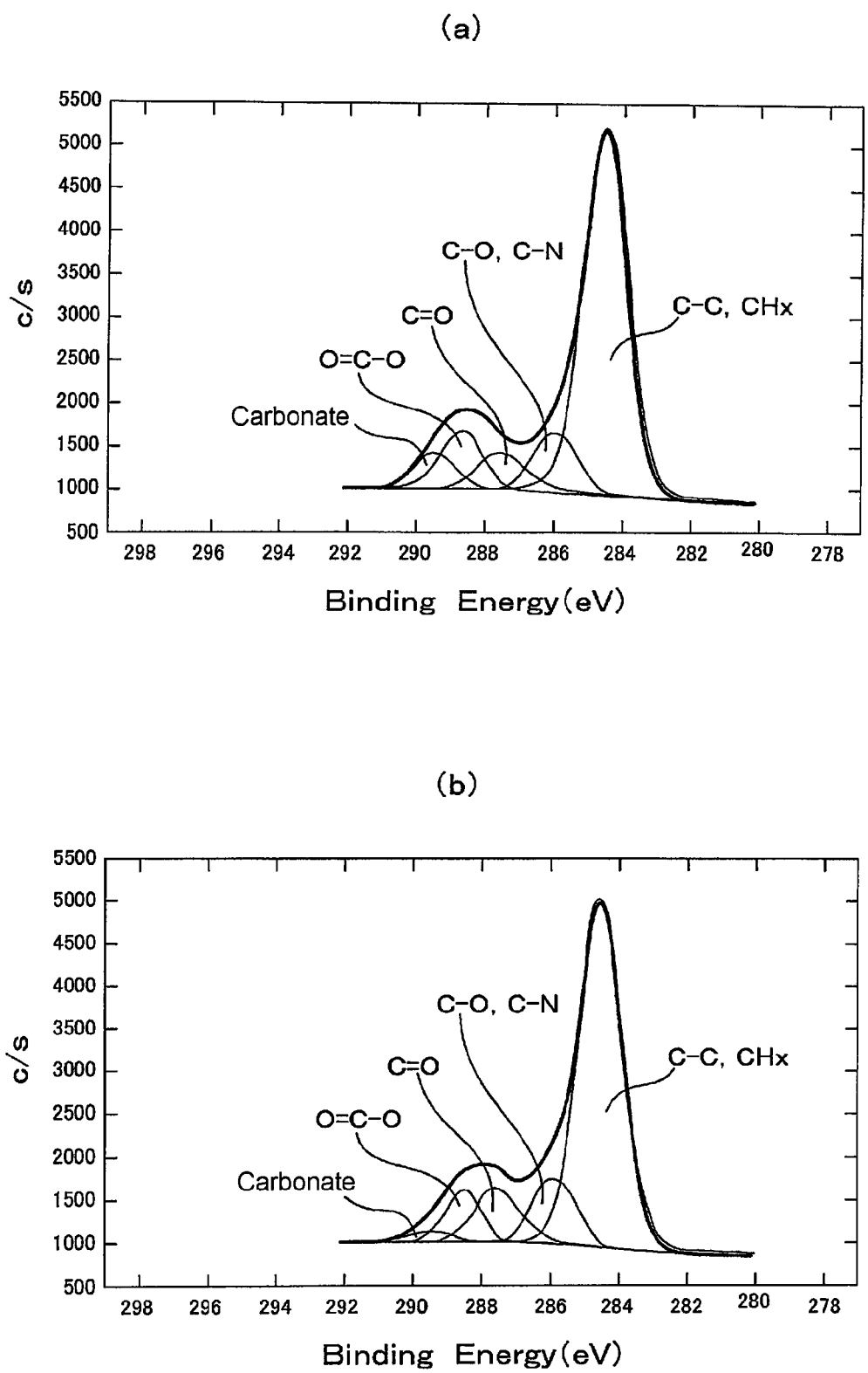
FIG. 4 shows the results of analysis by X-ray photoelectron spectroscopy of a surface modified layer in Example 1, wherein (a) is C1s spectra of the surface modified layer and (b) is C1s spectra of a surface layer portion of a light-shielding film before applying a surface modification treatment.

FIG. 3 shows the results of analysis by X-ray photoelectron spectroscopy (XPS) of a surface modified layer in later-described Example 1, wherein (a) is O (oxygen) 1s spectra of the surface modified layer and (b) is O1s spectra of a surface layer portion of a light-shielding film in the state where the surface modified layer by the above-mentioned surface modification treatment using the highly concentrated ozone gas and the unsaturated hydrocarbon gas is not formed. FIG. 4 shows the results of analysis by X-ray photoelectron spectroscopy (XPS) of the surface modified layer in Example 1, wherein (a) is C (carbon) 1s spectra of the surface modified layer and (b) is C1s spectra of the surface layer portion of the light-shielding film in the state where the surface modified layer by the above-mentioned surface modification treatment is not formed.

While details will be described later in Example 1, Example 1 relates to a phase shift mask blank in which a light-semitransmissive film made of a MoSi-based material and a light-shielding film made of a Cr-based material are laminated in this order on a transparent substrate and a surface modified layer is formed at a surface of the light-shielding film by a treatment of causing a highly concentrated ozone gas and an ethylene gas to act on the light-shielding film.

The surface modified layer is such that when an O1s spectrum measured by XPS is separated into a first peak at a binding energy of about 532 eV and a second peak at a binding energy of about 530 eV, the ratio of the first peak area to the second peak area is 2.0 or more. The first peak is formed mainly by an organic-based oxide component and a high-oxidation chromium oxide ($Cr_2O_3$ or the like) component (these are defined as components A). The second peak is formed mainly by a low-oxidation chromium oxide (CrO or the like) component and a chromium oxynitride component (these are defined as components B). In C1s spectra measured by XPS, a peak of carbonate (salt of $H_2CO_3$) due to the organic-based oxide component can be confirmed.

From these analysis results, the components A are 74% while the components B are 26% and, by the formation of the surface modified layer at the surface of the pattern-forming thin film, the ratio of the components A is increased (the ratio of the components B is reduced) and the ratio of the carbonate is increased compared to the state where the surface modified layer is not formed (spectra of FIGS. 3(b) and 4(b)). It is considered that the adhesion to a resist is improved by causing the surface of the thin film to be the oxide film (surface modified layer) containing the organic-based oxide.

In this invention, the thickness of the surface modified layer is not particularly limited. However, in order to sufficiently obtain the effect of improving the adhesion to the resist, it is preferably at least 1 nm or more. In order to increase the thickness of the surface modified layer, it is necessary to, for example, prolong the time of the above-mentioned treatment by the highly concentrated ozone gas and the unsaturated hydrocarbon gas. Further, if the thickness is too large, there is a possibility that the change in optical properties may increase. Therefore, the thickness may be enough if it can sufficiently improve the adhesion to the resist. From that point of view, the thickness is preferably set to 3 nm or less.

The presence of the surface modified layer can be confirmed by, for example, cross-sectional TEM observation of the thin film and the thickness of the surface modified layer can also be specified.

While the mask blank 10 shown in FIG. 1 has no resist film on the thin film 2, this invention includes a mask blank of a structure having an arbitrary resist film on the thin film 2.

This invention is particularly suitable for a mask blank having a chemically amplified resist film. A resist film-coated mask blank is often placed in a receiving case or the like and stored for a certain period of time. It has been found that if a transfer mask is manufactured using a resist film-coated mask blank stored for a long period of time (e.g. 40 days or more), there arises a problem of degradation of the shape of a formed resist pattern. This is considered to be caused by the fact that a contaminant (contaminant ions or the like) existing on a surface of a thin film under a resist film enters the resist film during the long-term storage to cause functional degradation (degradation of a pattern shape due to sensitivity change, reduction in resolution, or the like) of the chemically amplified resist. This causes a shape defect, such as "footing" in a positive chemically amplified resist film or "undercutting" in a negative chemically amplified resist film, at a skirt portion of a resist pattern. Particularly, in the case of the negative type, collapse of the resist pattern occurs due to "undercutting".

In the case of a mask blank with a resist film formed on a thin film having a surface modified layer according to this invention, even if a transfer mask is manufactured after long-term storage of the mask blank, it is possible to prevent degradation of a resist pattern shape. This is considered to be because, in the course of the formation of the surface modified layer, a contaminant on a surface of the thin film is removed or a contaminant is prevented from entering the resist film by the surface modified layer.

FIG. 2 is cross-sectional views showing processes of manufacturing a transfer mask using the mask blank of this invention.

Using the mask blank 10 in which the thin film 2 is formed on the transparent substrate 1 and the surface modified layer is formed at the surface of the thin film 2, a thin film pattern is formed by patterning the thin film of the mask blank using the photolithography. Specifically, a positive resist film 3 for electron beam writing, for example, is formed on the surface of the mask blank 10 (see the same figure, (a)) and then a required device pattern is written thereon (see the same figure, (b)). After the writing, the resist film 3 is developed, thereby forming a resist pattern 3a (see the same figure, (c)). Since the mask blank of this invention is excellent in adhesion to the resist, even if the line width of the resist pattern is less than ⅓ of the resist film thickness, it is possible to suppress the occurrence of collapse, chipping, or the like of the resist pattern.

Then, the thin film 2 is etched using the resist pattern 3a as a mask, thereby forming a thin film pattern 2a (see the same figure, (d)). As an etching method in this event, dry etching which is effective for forming a fine pattern can be preferably used.

The remaining resist pattern is removed, thereby obtaining a transfer mask 20 in which the thin film pattern 2a is formed on the transparent substrate 1 (see the same figure, (e)).

Using the mask blank of this invention, a fine resist pattern can be stably formed without the occurrence of pattern collapse, chipping, or the like and, therefore, finally, it is possible to manufacture a transfer mask having a fine transfer pattern formed with high accuracy.

Conventionally, in the case of a material containing a transition metal silicide compound (e.g. a molybdenum silicide compound) or the like, a surface treatment with a silane-based coupling agent such as HMDS (hexamethyldisilazane) is carried out before resist coating in order to ensure the adhesion to a resist. According to this invention, there is a merit that, regardless of the kind of material of a thin film of a mask blank, it is possible to improve the adhesion to a resist, particularly the adhesion to a chemically amplified resist.

When it is necessary to coat a resist a plurality of times in manufacturing processes of a transfer mask, a treatment of forming a surface modified layer of this invention may be carried out every time before resist coating. For example, in manufacturing processes of a halftone phase shift mask, a tritone phase shift mask, an enhancer phase shift mask, or the like, when an initially coated and remaining resist pattern is removed and then a resist film is formed again over the entire surface, thereby forming a light-shielding portion (light-shielding band) at an outer peripheral portion or the like of a mask, a treatment of forming a surface modified layer of this invention may be carried out before forming the resist film.

As described above with reference to the embodiment, this invention is suitable for a mask blank for use in the manufacture of particularly such a transfer mask that is required to have a fine transfer pattern and adapted to be used in an exposure apparatus that uses short-wavelength exposure light having a wavelength of 200 nm or less as an exposure light source. For example, this invention is suitable for the following mask blanks, the manufacture of the same, and the following transfer masks.

(1) Binary Mask Blank and Binary Mask in which the Thin Film is a Light-Shielding Film Made of a Material Containing a Transition Metal Such a binary mask blank has a structure having a light-shielding film on a transparent substrate. This light-shielding film is made of a material containing a transition metal alone, such as chromium, tantalum, or ruthenium or containing its compound. For example, there can be cited a light-shielding film made of chromium or a chromium compound in which one or more kinds of elements selected from elements such as oxygen, nitrogen, and carbon is/are added to chromium. Further, there can be cited, for example, a light-shielding film made of a tantalum compound in which one or more kinds of elements selected from elements such as oxygen, nitrogen, and boron is/are added to tantalum. Alternatively, it may be an alloy containing the above-mentioned transition metal and a metal such as aluminum, magnesium, gallium, germanium, or tin, or a compound in which one or more kinds of elements selected from elements such as oxygen, nitrogen, and carbon is/are added to such an alloy.

Such a binary mask blank may be such that the light-shielding film has a two-layer structure of a light-shielding layer and a front-surface antireflection layer, a three-layer structure further comprising a back-surface antireflection layer between the light-shielding layer and the substrate, or the like. The light-shielding film may be a composition gradient film in which the composition in its thickness direction changes continuously or stepwise.

(2) Phase Shift Mask Blank and Phase Shift Mask in which the Thin Film is a Light-Semitransmissive Film Made of a Material Containing a Compound of a Transition Metal and Silicon (Transition Metal Silicide, Particularly Molybdenum Silicide)

Such a phase shift mask blank has a structure having a light-semitransmissive film on a transparent substrate and a halftone phase shift mask, which is of the type in which shifter portions are provided by patterning the light-semitransmissive film, is manufactured. As such a phase shift mask, there can be cited one with a structure having a light-semitransmissive film on a transparent substrate and further having a light-shielding film (light-shielding band) on the light-semitransmissive film for the purpose of preventing pattern failure of a transfer target substrate due to a light-semitransmissive film pattern to be formed in a transfer region based on light transmitted through the light-semitransmissive film. Apart from the halftone phase shift mask blank, there can be cited a mask blank for a Levenson phase shift mask or an enhancer phase shift mask which is of the substrate dug-down type in which shifter portions are provided by digging down a transparent substrate by etching or the like.

The light-semitransmissive film is adapted to transmit light having an intensity that does not substantially contribute to exposure (e.g. 1% to 30% at an exposure wavelength) and to provide a predetermined phase difference (e.g. 180 degrees). By means of light-semitransmissive portions formed by patterning the light-semitransmissive film and light-transmissive portions formed with no light-semitransmissive film and adapted to transmit light having an intensity that substantially contributes to exposure, the halftone phase shift mask provides a relationship in which the phase of the light transmitted through the light-semitransmissive portions is substantially inverted with respect to the phase of the light transmitted through the light-transmissive portions. As a consequence, the lights having passed near the boundaries between the light-semitransmissive portions and the light-transmissive portions and bent into the others' regions due to the diffraction phenomenon cancel each other out. This makes the light intensity at the boundaries approximately zero to thereby improve the contrast, i.e. the resolution, at the boundaries.

The light-semitransmissive film is made of a material containing, for example, a compound of a transition metal and silicon (transition metal silicide) and there can be cited a material composed mainly of these transition metal and silicon and oxygen and/or nitrogen. As the transition metal, use can be made of molybdenum, tantalum, tungsten, titanium, hafnium, nickel, vanadium, zirconium, niobium, palladium, ruthenium, rhodium, or the like.

In the case of the structure having the light-shielding film on the light-semitransmissive film, since the material of the light-semitransmissive film contains the transition metal and silicon, a material of the light-shielding film preferably comprises particularly chromium having etching selectivity (etching resistance) to the light-semitransmissive film or a chromium compound in which an element/elements such as oxygen, nitrogen, and carbon is/are added to chromium.

(3) Binary Mask Blank and Binary Mask in which the Thin Film is a Light-Shielding Film Made of a Material Containing a Transition Metal and Silicon (Transition Metal Silicide, Particularly Molybdenum Silicide) or Containing a Compound of a Transition Metal and Silicon The light-shielding film is made of a material containing a compound of a transition metal and silicon and there can be cited a material composed mainly of these transition metal and silicon and oxygen and/or nitrogen. Alternatively, there can be cited a material composed mainly of a transition metal and oxygen, nitrogen, and/or boron. As the transition metal, use can be made of molybdenum, tantalum, tungsten, titanium, hafnium, nickel, vanadium, zirconium, niobium, palladium, ruthenium, rhodium, or the like.

When the light-shielding film is formed of molybdenum silicide compounds, it may have a two-layer structure of a light-shielding layer (MoSi or the like) and a front-surface antireflection layer (MoSiON or the like) or a three-layer structure further comprising a back-surface antireflection layer (MoSiON or the like) between the light-shielding layer and the substrate.

The light-shielding film may be a composition gradient film in which the composition in its thickness direction changes continuously or stepwise.

Further, in order to reduce the thickness of a resist film to thereby form a fine pattern, the structure may have an etching mask film on the light-shielding film. This etching mask film is preferably made of a material (chromium-based material) comprising particularly chromium having etching selectivity (etching resistance) to etching of the light-shielding film containing a transition metal silicide or comprising a chromium compound in which an element/elements such as oxygen, nitrogen, and carbon is/are added to chromium. On the other hand, when the light-shielding film is made of a chromium-based material, the etching mask film is preferably made of a silicon compound in which an element/elements such as oxygen and nitrogen is/are added to silicon or a material in which a transition metal such as molybdenum is added to such a silicon compound. Further, when the light-shielding film is made of a material comprising tantalum or comprising a tantalum compound in which an element/elements such as oxygen and nitrogen is/are added to tantalum, the etching mask film is preferably made of a chromium-based material. In this event, by imparting an antireflection function to the etching mask film, a transfer mask may be manufactured in the state where the etching mask film remains on the light-shielding film.

In (1) to (3), an etching stopper film having etching resistance to the light-shielding film or the light-semitransmissive film may be provided between the transparent substrate and the light-shielding film or between the light-semitransmissive film and the light-shielding film. The etching stopper film may be made of a material that allows the etching mask film to be stripped simultaneously when etching the etching stopper film.

(4) Reflective Mask Blank and Reflective Mask in which the Thin Film is an Absorber Film Made of a Material Containing Tantalum Such a reflective mask comprises a multilayer reflective film formed on a substrate and adapted to reflect exposure light, a buffer film formed in a pattern on the multilayer reflective film, and further an absorber film formed in a pattern on the buffer film and adapted to absorb the exposure light. The buffer film is provided between the multilayer reflective film and the absorber film for the purpose of protecting the multilayer reflective film in pattern forming and correcting processes of the absorber film. The buffer film may be omitted.

The absorber film may be satisfactory as long as it has a function of absorbing, for example, EUV light as exposure light. As the material containing tantalum, particularly Ta alone or a material composed mainly of Ta can be preferably used. The material composed mainly of Ta is, for example, an alloy of Ta. The crystalline state of such an absorber film preferably has an amorphous or microcrystalline structure in terms of smoothness and flatness. As the material composed mainly of Ta, it is possible to suitably use, for example, a material containing Ta and B, a material containing Ta and N, a material containing Ta and B and further containing at least one of O and N, or the like.

As the substrate, use can be made of a $SiO_2$—$TiO_2$-based glass or a quartz glass or of a crystallized glass precipitated with β-quartz solid solution or the like in the case of a crystallized glass. As an example of a metal substrate, an Invar alloy (Fe—Ni-based alloy) or the like can be cited. It is also possible to use a single-crystal silicon substrate.

The transfer mask may be a binary mask which does not use the phase shift effect and, among phase shift masks which use the phase shift effect, the transfer mask may be a halftone phase shift mask, a Levenson phase shift mask, an enhancer mask, a reflective mask, or the like. The transfer mask may be a reticle.

While the purpose of use differs from the transfer masks described above, this invention is also applicable to an imprint mold manufacturing method which uses a mask blank having a substrate dig-down pattern forming thin film on a main surface of a substrate made of a glass material and which forms a resist film on the thin film after forming the thin film on the substrate.

In the manufacture of an imprint mold (stamper) for use in forming a fine circuit pattern of a semiconductor device, manufacturing an optical component imparted with an optical function by a fine pattern, or forming a fine pattern of a magnetic layer in a magnetic recording medium for use in a hard disk drive or the like, use is made of a mask blank having a substrate dig-down pattern forming thin film on a glass substrate made of a synthetic quartz glass or the like. The imprint mold is manufactured by forming a required resist pattern on the mask blank, then etching the thin film using this resist pattern as a mask to form a thin film pattern, and then etching the substrate using this thin film pattern as a mask to form a stepped pattern (mask pattern) on the transparent substrate.

According to this invention, in such an imprint mold manufacturing method, it is preferable to apply the above-mentioned treatment using the highly concentrated ozone gas and the unsaturated hydrocarbon gas to the thin film made of, for example, a chromium-based material before forming the resist film.

EXAMPLES

Hereinbelow, the embodiment of this invention will be described in further detail with reference to Examples.

Example 1

Using a synthetic quartz glass substrate having a 6-inch square size with a thickness of 0.25 inches as a transparent substrate, a light-semitransmissive film made of nitrided molybdenum and silicon was first formed on the transparent substrate.

Specifically, using a mixed target of molybdenum (Mo) and silicon (Si) (Mo:Si=10 mol %:90 mol %), reactive sputtering (DC sputtering) was carried out by setting the power of a DC power supply to 3.0 kW in a mixed gas atmosphere of argon (Ar), nitrogen ($N_2$), and helium (He) (gas flow rate ratio Ar:$N_2$:He=5:49:46) at a gas pressure of 0.3 Pa, thereby forming a MoSiN film made of molybdenum, silicon, and nitrogen and having a thickness of 69 nm. Then, a heat treatment was applied to the substrate formed with the MoSiN film using a heating furnace in the atmosphere at a heating temperature of 450° C. for a heating time of 1 hour. The MoSiN film had a transmittance of 6.16% and a phase difference of 184.4 degrees for ArF excimer laser.

Then, the following light-shielding film was formed on the light-semitransmissive film.

Specifically, using a chromium (Cr) target as a sputtering target, reactive sputtering (DC sputtering) was carried out by setting the power of a DC power supply to 1.7 kW in a mixed gas atmosphere of argon (Ar), carbon dioxide ($CO_2$), nitrogen ($N_2$), and helium (He) (gas pressure 0.2 Pa, gas flow rate ratio AnCO$_2$:$N_2$:He=20:35:10:30), thereby forming a CrOCN layer having a thickness of 30 nm. Subsequently, reactive sputtering (DC sputtering) was carried out by setting the power of a DC power supply to 1.7 kW in a mixed gas atmosphere of argon (Ar) and nitrogen ($N_2$) (gas pressure 0.1 Pa, gas flow rate ratio Ar:$N_2$=25:5), thereby forming a CrN layer having a thickness of 4 nm. Finally, reactive sputtering (DC sputtering) was carried out by setting the power of a DC power supply to 1.7 kW in a mixed gas atmosphere of argon (Ar), carbon dioxide ($CO_2$), nitrogen ($N_2$), and helium (He) (gas pressure 0.2 Pa, gas flow rate ratio An$CO_2$:$N_2$:He=20:35:5:30), thereby forming a CrOCN layer having a thickness of 14 nm. In this manner, a chromium-based light-shielding film of a three-layer laminated structure having a total thickness of 48 nm was formed.

This light-shielding film was adjusted so that the optical density (OD) was 3.0 at the wavelength 193 nm of ArF excimer laser exposure light in the form of the laminated structure with the above-mentioned light-semitransmissive film. The front-surface reflectance of the light-shielding film was 20% at the wavelength of the exposure light.

The surface roughness of a surface of the light-shielding film was measured using an atomic force microscope (AFM) (measurement area 1 μm×1 μm). As a result, Ra=0.56 nm. Further, the flatness in 142 mm×142 mm was measured using a flatness measuring apparatus (manufactured by TROPEL Corporation: UltraFlat200M). As a result, it was 310 nm.

With respect to a mask blank in which the light-semitransmissive film and the light-shielding film were laminated on the glass substrate as described above, a highly concentrated ozone gas and an ethylene gas were supplied and mixed together near the surface of the light-shielding film, thereby carrying out a treatment of causing the highly concentrated ozone gas and the ethylene gas to act on the surface of the light-shielding film. In this event, the flow rate ratio of the highly concentrated ozone gas (100 vol %) to the ethylene gas was set to 2:1. The treatment time (time for causing the highly concentrated ozone gas and the ethylene gas to act) was set to 10 minutes and the substrate was heated to 60° C.

In the manner described above, a phase shift mask blank having a pattern-forming thin film of the laminated structure of the light-semitransmissive film and the light-shielding film on the glass substrate was manufactured.

A section of the thin film of the laminated structure of the manufactured phase shift mask blank was observed in detail using TEM (transmission electron microscope). As a result, a coating film (surface modified layer) with a thickness of about 1 nm was formed at a surface layer portion of the light-shielding film. Further, the composition of this coating film was analyzed in detail using X-ray photoelectron spectroscopy by setting the inclination of a detector to 30° with respect to a surface. As a result, the elemental composition (at % ratio) was Cr:16.6, O:40.6, N:5.5, C:37.3. Further, the atomic ratios to the number of chromium atoms are 0/Cr=2.44, N/Cr=0.33, and C/Cr=2.24.

The surface roughness of the surface of the thin film, i.e. the surface of the surface modified layer, was measured using an atomic force microscope (AFM) (measurement area 1 μm×1 μm). As a result, Ra=0.46 nm. That is, compared to the surface roughness Ra=0.56 nm of the surface of the light-shielding film before applying the above-mentioned treatment by the highly concentrated ozone gas and the ethylene gas, the surface roughness was reduced by 0.10 nm before and after the treatment (reduction ratio was 0.10/0.56×100=18%). Thus, the surface roughness was not degraded and was reduced. Further, cross-sectional TEM observation was carried out. As a result, a reduction in surface roughness and a reduction in grain size were confirmed before and after the treatment.

Further, the optical density of the laminated film of the light-semitransmissive film and the light-shielding film after the treatment was 3.0 and thus there was no change from that before the treatment. The front-surface reflectance of the light-shielding film at the wavelength 193 nm of ArF excimer laser exposure light was also confirmed. As a result, almost no change was observed from that before the treatment.

Further, the flatness in 142 mm×142 mm was measured using a flatness measuring apparatus (manufactured by TROPEL Corporation: UltraFlat200M). As a result, it was 306 nm. Therefore, the amount of change in flatness was 4 nm and thus there was almost no change.

Accordingly, it was confirmed that the surface modified layer was formed without change (degradation) in surface roughness, optical properties, and flatness before and after the highly concentrated ozone gas treatment.

FIG. 3 shows the results of analysis by X-ray photoelectron spectroscopy (XPS) of the surface modified layer in this Example, wherein (a) is O (oxygen) 1s spectra of the surface modified layer and (b) is O1s spectra of the surface layer portion of the light-shielding film before applying the above-mentioned treatment using the highly concentrated ozone gas and the ethylene gas. Further, FIG. 4 shows the results of analysis by X-ray photoelectron spectroscopy of the surface modified layer in this Example, wherein (a) is C (carbon) 1s spectra of the surface modified layer and (b) is C1s spectra of the surface layer portion of the light-shielding film before applying the above-mentioned treatment using the highly concentrated ozone gas and the ethylene gas.

The surface modified layer is such that when an O1s spectrum measured by XPS is separated into a first peak at a binding energy of about 532 eV and a second peak at a binding energy of about 530 eV, the ratio of the first peak area to the second peak area is 2.8. The first peak is formed mainly by an organic-based oxide component and a high-oxidation chromium oxide ($Cr_2O_3$ or the like) component (defined as components A). The second peak is formed mainly by a low-oxidation chromium oxide component and a chromium oxynitride component (defined as components B). From these analysis results, it is seen that the components A are 74% while the components B are 26% and that, by the formation of the surface modified layer at the surface of the pattern-forming thin film due to the above-mentioned treatment using the highly concentrated ozone gas and the ethylene gas, the ratio of the components A is increased while the ratio of the components B is reduced compared to the state before applying the treatment where the surface modified layer is not formed (spectra of FIG. 3(b)). In C1s spectra measured by XPS, it is seen that the ratio of carbonate is increased. Further, in O1s spectra, the first peak intensity before applying the highly concentrated ozone gas treatment is about 7400 c/s while the first peak intensity after applying the highly concentrated ozone gas treatment is about 9500 c/s. It is seen that the first peak is increased by the highly concentrated ozone gas treatment.

Then, a halftone phase shift mask was manufactured using the above-mentioned phase shift mask blank.

First, a chemically amplified negative resist film for electron beam writing (manufactured by FUJIFILM Electronic Materials Co., Ltd.: SLV08) was formed as a resist film on the mask blank. The resist film was formed by spin coating using a spinner (spin coating apparatus). After the resist film was coated, a predetermined heating drying treatment was carried out. The thickness of the resist film was set to 165 nm.

Then, using an electron beam writing apparatus, a required pattern was written on the resist film formed on the mask blank and, thereafter, the resist film was developed with a predetermined developer, thereby forming a resist pattern. In this event, there was no occurrence of collapse or chipping of the resist pattern. A LS (line and space) pattern and a SRAF (SubResolution Assist Feature) pattern were confirmed. As a result, a half-pitch 32 nm fine pattern was resolved.

Then, using the resist pattern as a mask, the light-shielding film was etched. A mixed gas of $Cl_2$ and $O_2$ was used as a dry etching gas. Subsequently, the light-semitransmissive film (MoSiN film) was etched, thereby forming a light-semitransmissive film pattern. A mixed gas of $SF_6$ and He was used as a dry etching gas.

Then, the remaining resist pattern was stripped. Then, again, the same resist film as described above was formed over the entire surface. Then, writing for forming a light-shielding band at an outer peripheral portion of a mask was carried out. After the writing, the resist film was developed to form a resist pattern. Using this resist pattern as a mask, the light-shielding film in other than a light-shielding band region was removed by etching.

The remaining resist pattern was stripped, thereby obtaining a phase shift mask. There was almost no change in the transmittance and the phase difference of the light-semitransmissive film compared to those at the time of the manufacture of the mask blank. The phase shift mask thus obtained had a 32 nm half-pitch fine pattern formed with excellent pattern accuracy.

Example 2

A phase shift mask blank was manufactured in the same manner as in Example 1 except that, in Example 1, the treatment time for causing the highly concentrated ozone gas (100 vol %) and the ethylene gas to act on the surface of the light-shielding film of the mask blank in which the light-semitransmissive film and the light-shielding film were laminated on the glass substrate was set to 30 minutes.

A section of the thin film of the laminated structure of the manufactured phase shift mask blank of this Example was observed in detail using TEM (transmission electron microscope). As a result, a coating film (surface modified layer) with a thickness of about 2 nm was formed at a surface layer portion of the light-shielding film. Further, the composition of this coating film was analyzed in detail using X-ray photoelectron spectroscopy by setting the inclination of a detector to 30° with respect to a surface. As a result, the elemental composition (at % ratio) was Cr:17.9, O:43.1, N:4.6, C:34.4. Further, the atomic ratios to the number of chromium atoms are O/Cr=2.41, N/Cr=0.26, and C/Cr=1.92.

The surface roughness of the surface of the surface modified layer was measured using an atomic force microscope (AFM) (measurement area 1 μm×1 μm). As a result, Ra=0.46 nm. Thus, compared to the surface roughness Ra=0.56 nm of the surface of the light-shielding film before applying the above-mentioned treatment by the highly concentrated ozone gas, the surface roughness was reduced by 0.10 nm before and after the treatment (reduction ratio was 0.10/0.56× 100=18%). Thus, the surface roughness was not degraded and was reduced. Further, cross-sectional TEM observation was carried out. As a result, a reduction in surface roughness and a reduction in grain size were confirmed before and after the treatment.

Further, the optical density of the laminated film of the light-semitransmissive film and the light-shielding film after the treatment was 3.0 and thus there was no change from that before the treatment. The front-surface reflectance of the light-shielding film at the wavelength 193 nm of ArF excimer laser exposure light was also confirmed. As a result, almost no change was observed from that before the treatment.

In the same manner as in Example 1, the surface modified layer in this Example was analyzed by XPS. As a result, when an O1s spectrum was separated into a first peak at a binding energy of about 532 eV and a second peak at a binding energy of about 530 eV, the ratio of the first peak area to the second peak area was 2.2. Further, in C1s spectra, the peak ratio of carbonate was increased. From these analysis results, the ratio of components A such as mainly an organic-based oxide component and a high-oxidation chromium oxide ($Cr_2O_3$ or the like) component in the surface modified layer was 69% while the ratio of components B such as mainly a low-oxidation chromium oxide component and a chromium oxynitride component in the surface modified layer was 31%. In O1s spectra, the first peak intensity after applying the highly concentrated ozone gas treatment was about 10500 c/s and thus was increased than that before the treatment.

Then, in the same manner as in Example 1, a halftone phase shift mask was manufactured using the above-mentioned phase shift mask blank.

A resist pattern was formed on the mask blank in the same manner as in Example 1. In this event, there was no occurrence of collapse or chipping of the resist pattern. A LS pattern and a SRAF pattern were confirmed. As a result, a half-pitch 32 nm fine pattern was resolved.

The obtained phase shift mask had a 32 nm half-pitch fine pattern formed with excellent pattern accuracy.

Example 3

Using a synthetic quartz glass substrate having a 6-inch square size with a thickness of 0.25 inches as a transparent substrate, a light-semitransmissive film, which was the same as that in Example 1, was formed on the transparent substrate, then heating was carried out, and then the following light-shielding film was formed.

Specifically, using a chromium (Cr) target as a sputtering target, reactive sputtering (DC sputtering) was carried out by setting the power of a DC power supply to 0.8 kW in a mixed gas atmosphere of argon (Ar), nitrogen ($N_2$), and helium (He) (gas pressure 0.2 Pa, gas flow rate ratio Ar:$N_2$:He=30:30:40), thereby forming a CrN layer having a thickness of 24 nm. Subsequently, reactive sputtering (DC sputtering) was carried out by setting the power of a DC power supply to 0.3 kW in a mixed gas atmosphere of argon (Ar), methane ($CH_4$), nitrogen monoxide (NO), and helium (He) (gas pressure 0.3 Pa, gas flow rate ratio Ar+$CH_4$:NO:He=65:3:40), thereby forming a CrON(C) layer having a thickness of 24 nm. In this manner, a chromium-based light-shielding film of a two-layer laminated structure having a total thickness of 48 nm was formed. Since this light-shielding film was formed using an in-line sputtering apparatus, the CrN layer and the CrON(C) layer were in the form of a gradient film in which the composition was gradient in its thickness direction.

This light-shielding film was adjusted to have an optical density of 3.0. The surface roughness of a surface of the light-shielding film was measured using an atomic force microscope (AFM) (measurement area 1 μm×1 μm). As a result, Ra=0.73 nm.

With respect to a mask blank in which the light-semitransmissive film and the light-shielding film were laminated on the glass substrate as described above, a highly concentrated ozone gas and an ethylene gas were supplied and mixed together near the surface of the light-shielding film, thereby carrying out a treatment of causing the highly concentrated ozone gas and the ethylene gas to act on the surface of the light-shielding film. In this event, the flow rate ratio of the highly concentrated ozone gas (100 vol %) to the ethylene gas was set to 2:1. The treatment time (time for causing the highly concentrated ozone gas and the ethylene gas to act) was set to 10 minutes and the substrate was heated to 60° C.

In the manner described above, a phase shift mask blank having a pattern-forming thin film of the laminated structure of the light-semitransmissive film and the light-shielding film on the glass substrate was manufactured.

A section of the thin film of the laminated structure of the manufactured phase shift mask blank was observed in detail using TEM (transmission electron microscope). As a result, a coating film (surface modified layer) with a thickness of about 1 nm was formed at a surface layer portion of the light-shielding film.

The surface roughness of a surface of the surface modified layer was measured using an atomic force microscope (AFM) (measurement area 1 μm×1 μm). As a result, Ra=0.64 nm. Compared to the surface roughness Ra=0.73 nm of the surface of the light-shielding film before applying the above-mentioned treatment by the highly concentrated ozone gas and the ethylene gas, the surface roughness was reduced by 0.09 nm before and after the treatment (reduction ratio was 0.09/0.73×100=12%). Thus, the surface roughness was not degraded and was reduced. Further, cross-sectional TEM observation was carried out. As a result, a reduction in surface roughness and a reduction in grain size were confirmed before and after the treatment.

Then, a phase shift mask was manufactured using the above-mentioned phase shift mask blank.

First, a chemically amplified negative resist film for electron beam writing (manufactured by FUJIFILM Electronic Materials Co., Ltd.: SLV08) was formed as a resist film on the mask blank. The resist film was formed by spin coating using a spinner (spin coating apparatus). After the resist film was coated, a predetermined heating drying treatment was carried out. The thickness of the resist film was set to 165 nm.

Then, using an electron beam writing apparatus, a required pattern was written on the resist film formed on the mask blank and, thereafter, the resist film was developed with a predetermined developer, thereby forming a resist pattern. In this event, there was no occurrence of collapse or chipping of the resist pattern. A LS pattern and a SRAF pattern were confirmed. As a result, a half-pitch 32 nm fine pattern was resolved.

Then, a phase shift mask was obtained in the same manner as in Example 1. The phase shift mask thus obtained had a 32 nm half-pitch fine pattern formed with excellent pattern accuracy.

Example 4

Using a synthetic quartz glass substrate having a 6-inch square size with a thickness of 0.25 inches as a transparent substrate, a MoSiN film (light-shielding layer) and a MoSiON film (front-surface antireflection layer) were formed as a light-shielding film on the transparent substrate.

Specifically, using a mixed target of Mo and Si (Mo:Si=21 mol %:79 mol %), a MoSiN film made of molybdenum, silicon, and nitrogen and having a thickness of 50 nm was formed by setting the power of a DC power supply to 2.1 kW in a mixed gas atmosphere of Ar and $N_2$ (gas flow rate ratio Ar:$N_2$=25:28) at a gas pressure of 0.07 Pa.

Then, using a target of Mo:Si=4 mol %:96 mol %, a MoSiON film made of molybdenum, silicon, oxygen, and nitrogen and having a thickness of 10 nm was formed by setting the power of a DC power supply to 3.0 kW in Ar, $O_2$, $N_2$, and He (gas flow rate ratio Ar:$O_2$:$N_2$:He=6:3:11:17) at a gas pressure of 0.1 Pa. The total thickness of the light-shielding film was set to 60 nm. The optical density (OD) of the light-shielding film was 3.0 at the wavelength 193 nm of ArF excimer laser exposure light.

Then, the following Cr-based etching mask film was formed on the above-mentioned MoSi-based light-shielding film.

Specifically, using a chromium (Cr) target as a sputtering target, reactive sputtering (DC sputtering) was carried out by setting the power of a DC power supply to 1.7 kW in a mixed gas atmosphere of argon (Ar), carbon dioxide ($CO_2$), nitrogen ($N_2$), and helium (He) (gas pressure 0.2 Pa, gas flow rate ratio An$CO_2$:$N_2$:He=20:35:5:30), thereby forming a CrOCN layer having a thickness of 10 nm.

The surface roughness of a surface of the etching mask film was measured using an atomic force microscope (AFM) (measurement area 1 μm×1 μm). As a result, Ra=0.52 nm.

With respect to a mask blank in which the MoSi-based light-shielding film and the Cr-based etching mask film were laminated on the glass substrate as described above, a highly concentrated ozone gas (100 vol %) and an ethylene gas were supplied and mixed together near the surface of the Cr-based etching mask film, thereby carrying out a treatment of causing the highly concentrated ozone gas and the ethylene gas to act on the surface of the Cr-based etching mask film. In this event, the flow rate ratio of the highly concentrated ozone gas to the ethylene gas was set to 2:1. The treatment time (time for causing the highly concentrated ozone gas and the ethylene gas to act) was set to 10 minutes and the substrate was heated to 60° C.

In the manner described above, a binary mask blank having the pattern-forming MoSi-based light-shielding film and the Cr-based etching mask film on the glass substrate was manufactured.

A section of the Cr-based etching mask film of the manufactured binary mask blank was observed in detail using TEM (transmission electron microscope). As a result, a coating film (surface modified layer) with a thickness of about 1 nm was formed at a surface layer portion of the etching mask film.

The surface roughness of a surface of the surface modified layer was measured using an atomic force microscope (AFM) (measurement area 1 μm×1 μm). As a result, Ra=0.43 nm. Compared to the surface roughness Ra=0.52 nm of the surface of the etching mask film before applying the above-mentioned treatment by the highly concentrated ozone gas and the ethylene gas, the surface roughness was reduced by 0.09 nm before and after the treatment (reduction ratio was 0.09/0.52×100=17%). Thus, the surface roughness was not degraded and was reduced.

Further, cross-sectional TEM observation was carried out. As a result, a reduction in surface roughness and a reduction in grain size were confirmed before and after the treatment.

Then, a binary mask was manufactured using the above-mentioned binary mask blank.

First, a chemically amplified negative resist film for electron beam writing (manufactured by FUJIFILM Electronic Materials Co., Ltd.: SLV08) was formed as a resist film on the mask blank. The resist film was formed by spin coating using a spinner (spin coating apparatus). After the resist film was coated, a predetermined heating drying treatment was carried out. The thickness of the resist film was set to 165 nm.

Then, using an electron beam writing apparatus, a required pattern was written on the resist film formed on the mask blank and, thereafter, the resist film was developed with a predetermined developer, thereby forming a resist pattern. In this event, there was no occurrence of collapse or chipping of the resist pattern. A LS pattern and a SRAF pattern were confirmed. As a result, a half-pitch 32 nm fine pattern was resolved.

Then, using the resist pattern as a mask, the etching mask film was etched. A mixed gas of $Cl_2$ and $O_2$ was used as a dry etching gas. Subsequently, using as a mask a pattern formed in the etching mask film, the MoSi-based light-shielding film (MoSiN/MoSiON) was etched, thereby forming a light-shielding film pattern. A mixed gas of $SF_6$ and He was used as a dry etching gas.

Then, the remaining resist pattern was stripped and further the etching mask film pattern was removed by etching.

A MoSi-based binary mask thus obtained had a 32 nm half-pitch fine pattern formed with excellent pattern accuracy.

Comparative Example

A phase shift mask blank was manufactured in the same manner as in Example 1 except that, in Example 1, the treatment of causing the highly concentrated ozone gas and the ethylene gas to act on the surface of the light-shielding film of the mask blank in which the light-semitransmissive film and the light-shielding film were laminated on the glass substrate was omitted.

The composition of a surface layer portion of the light-shielding film of the manufactured phase shift mask blank of this Comparative Example was analyzed in detail using X-ray photoelectron spectroscopy by setting the inclination of a detector to 30° with respect to a surface. As a result, the elemental composition (at % ratio) was Cr:18.5, O:36.1, N:8.5, C:36.9. Further, the atomic ratios to the number of chromium atoms are 0/Cr=1.94, N/Cr=0.46, and C/Cr=1.99.

The optical density of the light-semitransmissive film and the light-shielding film was 3.0. The front-surface reflectance of the light-shielding film at the wavelength 193 nm of ArF excimer laser exposure light was 20%.

The surface roughness of the surface of the light-shielding film was measured using an atomic force microscope (AFM) (measurement area 1 μm×1 μm). As a result, Ra=0.56 nm.

The results of analysis by XPS of the light-shielding film in this Comparative Example are shown in FIGS. 3(b) and 4(b) described before. When an O1s spectrum was separated into a first peak at a binding energy of about 532 eV and a second peak at a binding energy of about 530 eV, the ratio of the first peak area to the second peak area was 1.4. Further, in C1s spectra, there was almost no peak of carbonate. From these analysis results, the ratio of components A such as mainly a high-oxidation chromium oxide ($Cr_2O_3$ or the like) component and some organic-based oxide component was 58% while the ratio of components B such as mainly a low-oxidation chromium oxide component and a chromium oxynitride component was 42%. Compared to the results of the Examples described before, the ratio of the components A was relatively low and the ratio of the components B was relatively high.

Then, in the same manner as in Example 1, a halftone phase shift mask was manufactured using the above-mentioned phase shift mask blank.

A resist pattern was formed on the mask blank in the same manner as in Example 1. In this event, collapse or chipping of the resist pattern, which was considered to be caused by insufficient adhesion to the resist, occurred at portions thereof. A LS pattern and a SRAF pattern were confirmed. As a result, a half-pitch 45 nm fine pattern was not sufficiently resolved.

Also in the obtained phase shift mask, the CD change of a phase shift film pattern was as large as 10 nm or more due to the above-mentioned defect of the resist pattern. As a consequence, it is difficult to use the obtained phase shift mask as a transfer mask of the semiconductor design rule hp45 or subsequent generation.

Example 5

Using a single-wafer sputtering apparatus and using a tantalum (Ta) target as a sputtering target, reactive sputtering (DC sputtering) was carried out in a mixed gas atmosphere of argon (Ar) and nitrogen ($N_2$), thereby forming a TaN film (film composition Ta=85 at %, N=15 at %) to a thickness of 42 nm on a transparent substrate made of a synthetic quartz glass. Subsequently, using a Ta target, a TaO film (film composition Ta=42 at %, O=58 at %) was formed to a thickness of 9 nm in a mixed gas atmosphere of argon (Ar) and oxygen ($O_2$). In this manner, a light-shielding film for ArF excimer laser (wavelength 193 nm) in the form of a laminate of the TaN film and the TaO film was formed. The film compositions of the respective layers are the results of analysis by AES (Auger Electron Spectroscopy).

The optical density of the light-shielding film was 3.0 for ArF excimer laser. The surface roughness of a surface of the light-shielding film was measured using an atomic force microscope (AFM) (measurement area 1 μm×1 μm). As a result, Ra=0.27 nm.

Then, under the same conditions as in Example 1, a treatment using a highly concentrated ozone gas (100 vol %) and an ethylene gas was applied to a mask blank in which the Ta-based light-shielding film was formed on the glass substrate.

In the manner described above, a binary mask blank having the Ta-based light-shielding film on the glass substrate was manufactured.

A section of the Ta-based light-shielding film of the manufactured binary mask blank was observed in detail using TEM (transmission electron microscope). As a result, a coating film (surface modified layer) with a thickness of about 1.5 nm was formed at a surface layer portion of the Ta-based light-shielding film.

The surface roughness of a surface of the surface modified layer was measured using an atomic force microscope (AFM). As a result, the surface roughness was not degraded.

Further, cross-sectional TEM observation was carried out. As a result, it was confirmed that there was almost no change in surface roughness and grain size before and after the treatment.

Then, a binary mask was manufactured using the above-mentioned binary mask blank.

First, a chemically amplified negative resist film for electron beam writing having a thickness of 100 nm was formed on the mask blank. Then, writing of a required pattern was carried out using an electron beam writing apparatus. Then, developing with a predetermined developer was carried out, thereby forming a resist pattern. In this event, there was no occurrence of collapse or chipping of the resist pattern. A LS pattern and a SRAF pattern were confirmed. As a result, a half-pitch 32 nm fine pattern was resolved.

Then, using this resist pattern as a mask, dry etching with a fluorine-based ($CF_4$) gas was carried out to form a TaO film pattern. Subsequently, dry etching with a chlorine-based ($Cl_2$) gas was carried out to form a TaN film pattern. Further, 30% additional etching was carried out, thereby forming a light-shielding film pattern in the form of a laminated film of the TaO film pattern and the TaN film pattern on the substrate 1. Subsequently, the resist pattern on the light-shielding film pattern was stripped.

A Ta-based binary mask thus obtained had a 32 nm half-pitch fine pattern formed with excellent pattern accuracy.

DESCRIPTION OF SYMBOLS 1 transparent substrate
2 pattern-forming thin film
3 resist film
10 mask blank
20 transfer mask

The invention claimed is:

1. A mask blank comprising:
a substrate; and
a thin film which is formed on the substrate and which is for forming a transfer pattern and made of a material containing a metal,
wherein the thin film has a surface modified layer comprising an oxide film containing a hydrocarbon.

2. The mask blank according to claim 1, wherein the thin film is a laminated film and an uppermost layer of the laminated film is made of a material containing, as the metal, a transition metal.

3. The mask blank according to claim 2,
wherein the transition metal is chromium, and
wherein the surface modified layer is such that when an O (oxygen) 1s spectrum measured by X-ray photoelectron spectroscopy (XPS) is separated into a first peak at a binding energy of about 532 eV and a second peak at a binding energy of about 530 eV, a ratio of a first peak area to a second peak area is 2.0 or more.

4. The mask blank according to claim 2, wherein the transition metal is tantalum.

5. The mask blank according to claim 1, wherein the surface modified layer has a surface roughness (Ra) of 0.70 nm or less.

6. The mask blank according to claim 1, wherein the surface modified layer has a thickness in a range of 3 nm or less.

7. The mask blank according to claim 1, wherein the thin film is a laminated film and an uppermost layer of the laminated film is made of a material containing a transition metal and silicon.

8. The mask blank according to claim 1, comprising a chemically amplified resist film formed on the thin film.

9. The mask blank according to claim 8, wherein the chemically amplified resist film is of a negative type.

10. A transfer mask obtained by patterning the thin film in the mask blank according to claim 1 to form a transfer pattern.

11. A mask blank manufacturing method comprising:
forming, on a substrate, a thin film which is for forming a transfer pattern and is made of a material containing a metal; and
applying, to the thin film, a treatment of forming a surface modified layer comprising an oxide film containing a hydrocarbon at a surface of the thin film.

12. The mask blank manufacturing method according to claim 11, wherein the treatment causes an ozone gas and an unsaturated hydrocarbon gas to act on the thin film.

13. The mask blank manufacturing method according to claim 12, wherein the ozone gas has a concentration of 50 to 100 vol %.

14. The mask blank manufacturing method according to claim 12, wherein the unsaturated hydrocarbon is a low-grade unsaturated hydrocarbon having a carbon number of 2 to 4.

* * * * *